United States Patent [19]

Yamada

[11] 4,366,442
[45] Dec. 28, 1982

[54] AMPLIFIER WITH MUTING CIRCUIT
[75] Inventor: Hisashi Yamada, Yokohama, Japan
[73] Assignee: Tokyo Shibaura Denki Kabushiki Kaisha, Kawasaki, Japan
[21] Appl. No.: 185,798
[22] Filed: Sep. 10, 1980
[30] Foreign Application Priority Data
Sep. 19, 1979 [JP] Japan .............................. 54/120259
[51] Int. Cl.³ .......................... H03G 3/34; H03F 3/30
[52] U.S. Cl. ..................................... 330/51; 330/254; 330/255; 330/265; 330/267
[58] Field of Search ................. 330/51, 255, 257, 254, 330/265, 267, 268, 273, 274, 279, 296, 297

[56] References Cited
U.S. PATENT DOCUMENTS

| | | | |
|---|---|---|---|
| 3,760,288 | 9/1973 | Leonard | 330/255 |
| 3,867,709 | 2/1975 | Seki et al. | 330/267 X |
| 4,176,323 | 11/1979 | Odell | 330/263 |
| 4,219,781 | 8/1980 | Naokaua | 330/255 X |

Primary Examiner—James B. Mullins
Attorney, Agent, or Firm—Oblon, Fisher, Spivak, McClelland & Maier

[57] ABSTRACT

An amplifier is disclosed having a differential amplifier circuit, a current mirror circuit, a bias circuit and first and second single ended push-pull (SEPP) circuits connected in parallel to each other between a power source and earth. The first SEPP circuit includes a pair of diode-connected complementary transistors whose emitters are connected together and connected to the amplifier circuit. The second SEPP circuit includes a pair of diode-connected complementary transistors whose emitters are electrically insulated from those of the first SEPP circuit and connected to an output terminal of the amplifier. When a muting switch is opened, the supply of currents to the bias circuit is shut off, causing the first and second SEPP circuits to become unactuated and thereby attenuating an output signal from the output terminal of the amplifier.

6 Claims, 2 Drawing Figures

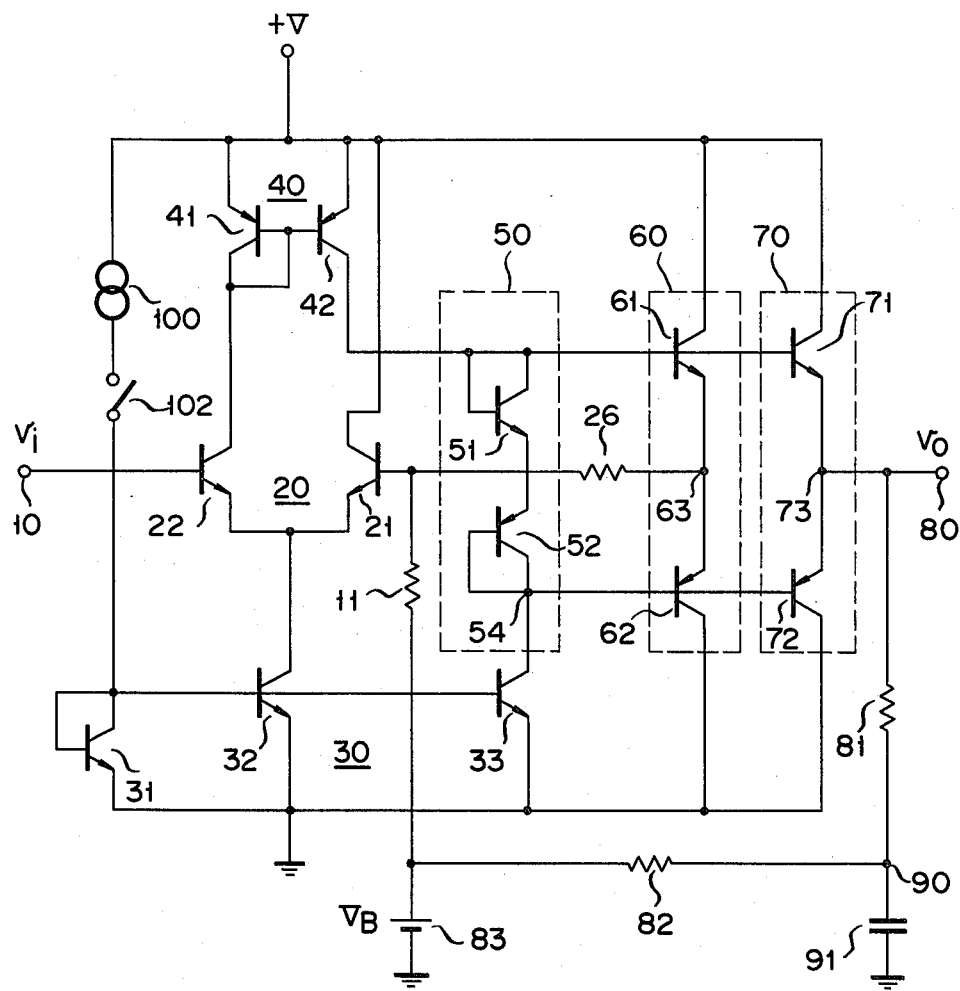
F I G. 2

AMPLIFIER WITH MUTING CIRCUIT

BACKGROUND OF THE INVENTION

This invention relates to an amplifier, and more particularly to an amplifier having a function of muting, if necessary, signals sent forth from an output terminal.

An amplifier electrically amplifying a sound signal generally comprises a muting circuit provided with a field effect transistor (abbreviated as "FET") in order to attenuate signals produced from an amplifier output terminal without cutting off a power supply switch. This muting circuit is formed of the FET and a capacitor connected in series between an amplifier input terminal and a grounding terminal. The gate of the FET is connected to a terminal supplied with a muting-instructing signal (hereinafter referred to as "muting signal terminal") through a muting switch. Where the muting switch is closed and the FET gate is supplied with a muting-instructing signal (hereinafter referred to as "muting signal"), then the FET is rendered conducting. As a result, signals are prevented from being generated from the amplifier output terminal. One reason why the FET is applied is that this type of transistor shows a bidirectional characteristic between the source and drain regions and can be rendered conducting even with respect to signal components having both positive and negative polarities. Another reason for the acceptance of the FET is that it has a far higher linearity of characteristic than the ordinary transistor. In some cases, the FET is connected in series to the input side of the amplifier. However, the conventional amplifier using the FET presents difficulties in being assembled with the muting circuit in a single integrated circuit. Further drawback of the conventional amplifier is that since the amplifier itself is always rendered conducting regardless of whether the muting circuit is or is not actuated, switching noises arising when the FET switch is closed are transmitted to the output terminal of the amplifier.

SUMMARY OF THE INVENTION

It is accordingly the object of this invention to provide an amplifier, which can carry out muting without using the FET switch to suppress the transient occurrence of switching noises during the muting mode, and can be easily assembled with a muting circuit in a single integrated circuit.

According to this invention, therefore, the amplifier having a single ended push-pull circuit (abbreviated as "SEPP circuit") connected to a bias circuit is additionally provided with muting means for attenuating signals delivered from the SEPP circuit and control means for actuating the muting means for a prescribed length of time.

BRIEF DESCRIPTION OF THE DRAWINGS

FIG. 2 indicates the circuit arrangement of an amplifier according to a second embodiment of the invention which similarly has a muting function.

DETAILED DESCRIPTION OF THE PREFERRED EMBODIMENTS

Figure 1:
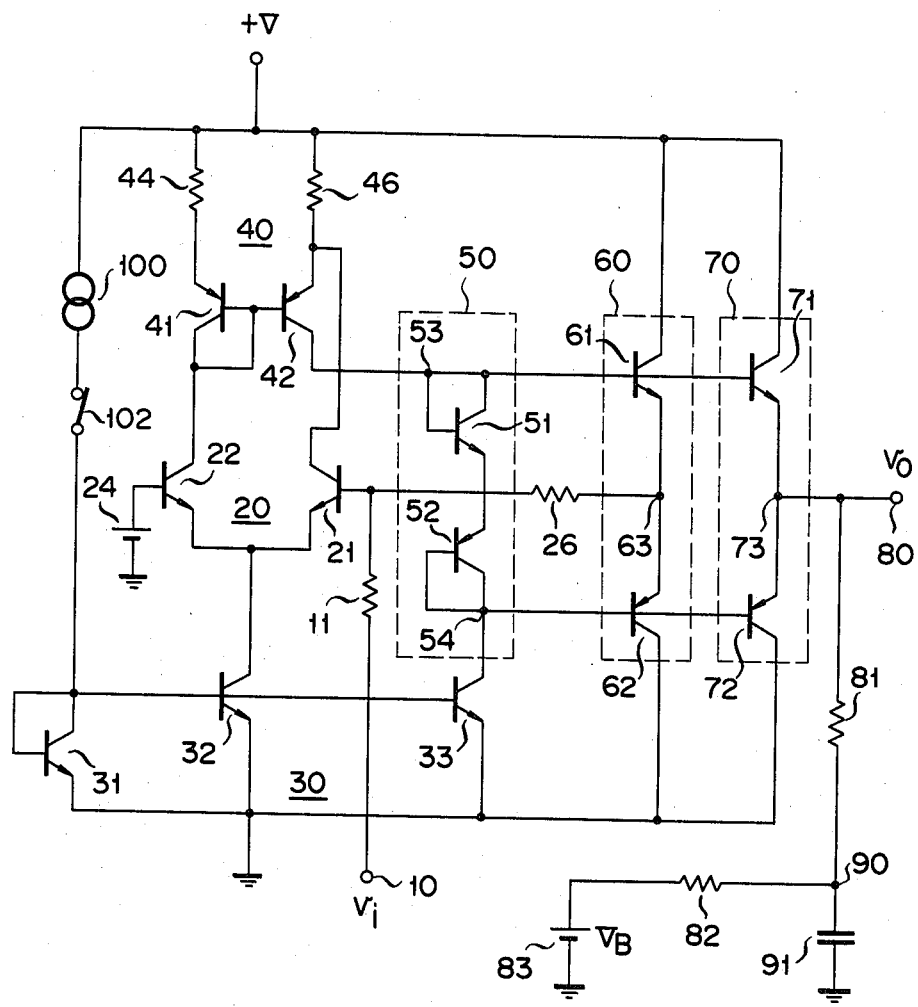
FIG. 1 shows the circuit arrangement of an amplifier according to a first embodiment of this invention which has a muting function.

With an amplifier according to the first embodiment of this invention shown in FIG. 1, an input signal $v_i$ supplied to an input terminal 10 is conducted through a transistor 11 to the base of a transistor 21 which serves as an inverting input of a differential amplifier circuit 20. A reference supply 24 is connected to the base of a transistor 22 which serves as a non-inverting input of the differential amplifier circuit 20. The junction of the emitters of the transistors 21, 22 is grounded through the collector-emitter circuit of a constant-current supply transistor 32 constituting part of a power supply circuit 30. The collector of the transistor 22 which serves as an output of the differential amplifier circuit 20 is connected to the input terminal of a current mirror circuit 40 which is formed of transistors 41, 42. The output terminal of the current mirror circuit 40 is connected to a bias circuit 50. The emitters of the transistors 41, 42 are connected to a power source +V through the corresponding resistors 44, 46. The bias circuit 50 is formed of a pair of transistors 51, 52 which are complementary to each other and are diode-connected (that is, connected in series in terms of D.C.). The base and collector of the transistor 51 are connected together. The junction 53 of the base and collector is connected to the output terminal of the current mirror circuit 40, or the collector of the transistor 42. The junction 53 is connected to the base of a transistor 61 constituting a first SEPP circuit component 60 and the base of another transistor 71 constituting a second SEPP circuit component 70. The base and collector of the remaining transistor 52 of the bias circuit 50 are similarly connected together. The junction 54 of the base and collector is grounded through another constant-current supply transistor 33 of the power supply circuit 30. The junction 54 is further connected to the base of the remaining transistor 62, a constituent of the first SEPP circuit component 60 and the base of the remaining transistor 72, a constituent of the second SEPP circuit component 70. A pair of diode-connected complementary transistors 61, 62 are connected between the power source +V and earth to constitute the first SEPP circuit component 60. The remaining paired diode-connected complementary transistors 71, 72 are similarly connected between the power source +V and earth to constitute the second SEPP circuit component 70. The junction 63, for example, of the emitters of the transistors 61, 62 constituting the first SEPP circuit component 60 is connecting to the base of the transistor 21 of the differential amplifier circuit 20 through a negative feedback resistor 26. The junction 63 acts as an output for signals sent forth from the first SEPP circuit component 60. The junction 73 of the emitters of the transistors 71, 72 constituting the second SEPP circuit component 70 is connected to an output terminal 80 of an amplifier, from which a signal $v_o$ is generated. The junction 73 is further connected to the positive pole of a voltage source 83 generating D.C. voltage $+V_B$ through resistors 81, 82. The negative pole of the voltage source 83 is grounded. The junction 90 of the resistors 81, 82 is grounded through a capacitor 91.

A series circuit consisting of a constant-current source 100, muting switch 102 and a transistor 31 constituting a power supply circuit 30 is connected between the power source +V and earth. The constant-current source 100 supplies bias current to the transistors 32, 33 constituting the power source circuit 30. One of the contacts of the muting switch 102 is connected to the constant-current source 100, and the other contact of the muting switch 102 is connected to the collector and base of the transistor 31 and also to the bases of the transistors 32, 33. The emitter of the transistor 31 is grounded.

Where, with an amplifier according to a first embodiment of this invention shown in FIG. 1, the muting switch 102 is closed, then an input signal $v_i$ supplied to the input terminal 10 is amplified by the input stage differential amplifier circuit 20. An output signal from the differential amplifier circuit 20 has its phase inverted by the current mirror circuit 40. The phase-inverted signal is later conducted to the bias circuit 50. A current having the same amperage as the current flowing through the paired transistors 51, 52 constituting the bias circuit 50 flows to the paired transistors 61, 62 constituting the first SEPP circuit component 60 and the paired transistors 71, 72 constituting the second SEPP circuit component 70. Therefore, the junction 73 of the second SEPP circuit component 70 products an output signal $v_o$ obtained by amplifying the input signal $v_i$.

Where the muting switch 102 is opened, the transistors 32, 33 are prevented to receive the bias current from the constant-current source 100, and are rendered nonconducting. Where the transistor 33 is rendered nonconducting, then no current flows through the transistors 51, 52 of the bias circuit 50, which in turn is cut off. At this time, the transistors 61, 62 of the first SEPP circuit component 60 and the transistors 71, 72 of the second SEPP circuit component 70 are not supplied with current. Consequently, both SEPP circuit components 60, 70 are unactuated, and no signal is supplied to the junctions 63, 73 of the SEPP circuit components 60, 70. Thus, the amplifier according to the embodiment of this invention shown in FIG. 1 is brought to the muting mode.

During the muting mode, the first and second SEPP circuit components 60, 70 are unactuated. Consequently, the potentials of the junctions 63, 73 of both SEPP circuit components 60, and 70 are floating in terms of D.C. and become unstable, giving rise to the occurrence of noise (the so-called pop noise) at the output terminal 80 of the amplifier. With the first embodiment of FIG. 1, however, the output terminal 80 always receives a predetermined D.C. voltage $+V_B$ from the voltage source 83, and is protected from the occurrence of noise. The capacitor 91 is used to absorb signal components leaking from the voltage source 83.

With the embodiment of FIG. 1, the output terminal 80 of the amplifier is connected to the junction 73 of the second SEPP circuit component 70 for the reason given below. The junction 63 of the first SEPP circuit component 60 is connected through a negative feedback resistor 26 to the base of the transistor 21 which serves as the inverting input of the differential circuit 20. The base of the transistor 21 is also connected to the input terminal 10 of the amplifier through the resistor 11. Even during the muting mode of the amplifier, therefore, the input signal $v_i$ supplied to the input terminal 10 leaks to the junction 63 of the first SEPP circuit component 60 through the resistors 11, 26. If, therefore, the output terminal 80 of the amplifier is connected to the junction 63 of the first SEPP circuit component 60, then the muting function of the subject amplifier is obstructed by the above-mentioned input signal $v_i$ leaking to the output terminal 63 of the first SEPP circuit component 60. It is for this reason that the output terminal 80 of the amplifier is connected to the junction 73 of the second SEPP circuit component 70. With the junction 63 of the first SEPP circuit component 60 viewed from the side of the junction 73 of the second SEPP circuit component 70, there are connected between both output terminals 63, 73. The transistors 71, 61 whose base-emitter junctions have the mutually opposite polarities, and also the transistors 72, 62 whose base-emitter junctions similarly have the mutually opposite polarities. Even where, therefore, the voltage of the output terminal 63 of the first SEPP circuit component 60 is changed, at least one backward-biased transistor is always connected between the output terminals 63, 73 of the first and second SEPP circuit components 60, 70. This backward-biased transistor prevents the input signal $v_i$ supplied to the input terminal 10 of the amplifier and later leaking to the junction 63 of the first SEPP circuit component 60 from being further transmitted to the output terminal 73 of the second SEPP circuit component 70. During the muting mode of an amplifier according to the first embodiment of FIG. 1, therefore, signals are fully attenuated while flowing through a passage defined between the input terminal 10 and output terminal 80 of the amplifier, thereby prominently elevating the muting function of the amplifier.

The amplifier according to the first embodiment of FIG. 1 has the advantages that an output stage SEPP circuit concurrently acts as a switching circuit for the muting of the amplifier, thereby dispensing with the FET used in the conventional amplifier, enabling the whole of the amplifier to be easily assembled in a single integrated circuit. And during the muting mode of the amplifier, the SEPP circuit remains unactuated, thereby preventing transient noise arising at the opening of the muting switch 102 from being transmitted to the output terminal 80 of the amplifier.

Description is now given with reference to FIG. 2 of an amplifier according to a second embodiment of this invention. The base of the transistor 22 which serves as the non-inverting input of the differential amplifier circuit 20 is connected to the input terminal 10 of the subject amplifier. The base of transistor 21 which serves as the inverting input of the differential amplifier circuit 20 is connected to the positive pole of the voltage source 83 through the resistor 11. The other parts of the second embodiment of FIG. 2 are the same as those of the first embodiment of FIG. 1. With the second embodiment arranged as described above, an input signal $v_i$ supplied to the input terminal 10 of the amplifier does not theoretically tend to leak to the junction 63 of the first SEPP circuit component 60. Actually, however, signal current delivered from the outside of the amplifier is likely to arise in the power supply circuit. These external signal current is conducted from the voltage source 83 through the resistors 11, 26 and leak to the junction 63 of the first SEPP circuit component 60. If, therefore, the output terminal 80 of the amplifier is connected to the junction 63, then muting can not be effected with the attenuation degree of, for example, $-80$ dB. With the second embodiment of FIG. 2, therefore, the output terminal 80 of the amplifier is connected to the junction 73 of the second SEPP circuit component 70 for the reason given above as in the case of the first embodiment of FIG. 1.

With the second embodiment of FIG. 2, the base of the transistor 22 of the differential amplifier circuit 20 is connected to the input terminal 10, dispensing with the reference supply 24 used in the first embodiment of FIG. 1. Therefore, the whole circuit arrangement of the second embodiment is further simplified, offering advantage in assembling an amplifier device in an integrated circuit.

Although the present invention has been shown and described with respect to particular embodiments, various changes and modifications which are obvious to a person skilled in the art to which the invention pertains are deemed to be included in the spirit, scope and concept of the invention.

What is claimed is:

1. An amplifier comprising:
   (a) an amplifier circuit having an input to which an electrical input signal is supplied and an output;
   (b) a current mirror circuit having an input connected to the output of said amplifier circuit and an output;
   (c) a single ended push-pull means, formed of a plurality of single ended push-pull circuits including at least first and second single ended push-pull circuits connected in parallel to each other, for amplifying said electrical input signal, said first single ended push-pull circuit being formed on a pair of diode-connected complementary transistors having emitter electrodes which are connected to each other and which are connected to said amplifier circuit, and said second single ended push-pull circuit being formed of a pair of diode-connected complementary transistors having emitter electrodes which are connected to each other, which are electrically insulated from the emitter electrodes of said first single ended push-pull circuit and which are connected to an output terminal from which an output electrical signal is generated;
   (d) bias circuit means, connected between said current mirror circuit and said single ended push-pull means, for supplying bias to said single ended push-pull means; and
   (e) muting means, connected at least to said bias circuit and including a muting switch, for stopping the supply of current at least to said bias circuit means in response to the switching operation of said muting switch, thereby muting the output electrical signal.

2. An amplifier according to claim 1, wherein said amplifier circuit is formed of a differential pair of transistors having the same conductivity type, a first transistor having a base electrode to which a predetermined voltage is supplied and the second transistor having a base electrode connected to said input to which the electrical input signal is supplied.

3. An amplifier according to claim 2, wherein the emitter electrodes of the transistors of said first single ended push-pull circuit are connected through at least one resistor to said base electrode of said second transistor of said amplifier circuit.

4. An amplifier according to claim 2, wherein the emitter electrodes of the transistors of said first single ended push-pull circuit are connected through at least one resistor to the base electrode of the first transistor of said amplifier circuit.

5. An amplifier according to claim 2, further comprising a voltage source means, connected to the base electrode of said first transistor of said amplifier circuit and the output terminal, for supplying reference voltage having a predetermined voltage to the base electrode of said first transistor and the output terminal.

6. An amplifier according to claim 1, wherein said muting means includes means connected to said amplifier circuit for stopping the supply of current to said amplifier circuit in response to the switching operation of said muting switch.

* * * * *